US005754667A

United States Patent [19]

Nazar et al.

[11] Patent Number: 5,754,667

[45] Date of Patent: May 19, 1998

[54] AUDIO FILTER WITH MAGNETIC FIELD CANCELLATION

[75] Inventors: Mark B. Nazar, Stoughton; Frank M. Barone, Beverly; Moses Gabbay, Chestnut Hill, all of Mass.

[73] Assignee: Boston Acoustics, Inc., Peabody, Mass.

[21] Appl. No.: 377,657

[22] Filed: Jan. 25, 1995

[51] Int. Cl.[6] .......... H03G 5/00

[52] U.S. Cl. .......... 381/99; 381/98; 381/94

[58] Field of Search .......... 381/99, 98, 94; 379/98

[56] References Cited

U.S. PATENT DOCUMENTS

| | | | |
|---|---|---|---|
| 3,491,216 | 1/1970 | Picchiottino . | |
| 4,658,229 | 4/1987 | Chen et al. | 335/216 |
| 4,771,466 | 9/1988 | Modafferi | 381/99 |
| 5,519,781 | 5/1996 | Kukurudza | 381/94 |
| 5,568,560 | 10/1996 | Combest | 381/98 |

*Primary Examiner*—Curtis Kuntz
*Assistant Examiner*—Duc Nguyen
*Attorney, Agent, or Firm*—Wolf, Greenfield & Sacks, P.C.

[57] ABSTRACT

An audio filter for use with loud speakers which substantially eliminates magnetic fields emanating from inductors of the filter by the inductors for each channel being physically oriented and electrically connected so that the magnetic fields generated by the inductors for each channel are self-cancelling. For preferred embodiments, the pair of inductors for each channel are side-by-side in close proximity to each other with current flowing in opposite directions through the coils.

5 Claims, 2 Drawing Sheets

AUDIO FILTER WITH MAGNETIC FIELD CANCELLATION

FIELD OF THE INVENTION

This invention relates to audio filters for use with loudspeakers and more particularly to a configuration for such filters which results in the substantial elimination of magnetic field emanation from the filter.

BACKGROUND OF THE INVENTION

Audio loudspeakers are frequently used near magnetic field sensitive equipment such as video playback equipment, computers, magnetic disk storage media and magnetic tape storage media. Since magnetic fields can cause video distortion or can otherwise interfere with the operation of such equipment, efforts have been made to provide shielding to minimize magnetic field emanation from loudspeakers. In particular, heavy treatments of magnetically soft material have been provided around the speaker transducers to provide shielding, or a magnetic return path to contain the magnetic field. Reverse polarized magnets have also been utilized with the speaker transducer to reduce the external magnetic fields.

Another source of magnetic field emanation from loudspeakers are the electric filters utilized with such loudspeakers to direct audio signals to the appropriate speaker of a speaker array or system. Thus, the filter may have one channel for directing low frequency audio signals to a low range or woofer speaker, another channel for directing high frequency audio signals to a high range or tweeter speaker and perhaps one or more additional channels for directing signals in one or more mid-range bands to appropriate speakers for such bands. Each filter channel serves as a relatively low impedance path for signals within the appropriate frequency band and has a much higher impedance path for signals outside the appropriate band. The circuity for each filter channel generally includes groupings of electrical capacitor(s), inductor(s), and resistor(s).

The electric currents for the audio signals passing through the circuits for each channel vary with time in accordance with the audio output to be provided by the corresponding loudspeaker. As these varying currents flow through the inductors of each circuit, a time-changing magnetic field is produced which emanates from the loudspeaker and may cause problems in adjacent magnetic field sensitive video, computer or other equipment. Since it is not uncommon for such equipment to be in close proximity to the speaker, and since the filters are normally designed to either be part of or in close proximity to the speakers, this can result in annoying time-varying distortion and other errors. To the extent this problem has been dealt with in the past, it has either been dealt with by providing more magnetically soft iron shielding material, particularly in the area around the filter coils, or by instructing users to place the loudspeakers a "safe" distance away from such sensitive equipment.

Since adding significant quantities of magnetically soft iron shielding material to speakers increases the weight, bulk and cost of the speakers, and since in many applications it is not desirable to space the speakers at a sufficient distance from magnetic field sensitive equipment to avoid potential interference, it is desirable that another solution be found to the magnetic field emanation problem from the filter inductor coils which does not require the use of additional magnetically soft iron shielding material.

SUMMARY OF THE INVENTION

In accordance with the above, this invention provides an audio filter which solves the magnetic field emanation problem by dividing inductor coils into substantially matching pairs of coils which are physically and electrically oriented so as to substantially cancel the magnetic fields generated by the coils. More particularly, this invention provides an electric filter circuit which is designed to operate in a loudspeaker system having at least two speakers each of which is designed to operate in a selected frequency band. The filter circuit applies audio signals to each of the speakers which is in the frequency band for which the speaker is designed. A filter channel is provided for each speaker, with each of the channels having at least two inductors, and generally at least one capacitor, which capacitors and inductors are selected and connected so as to provide a low impedance to audio signals in the frequency band for the corresponding speaker and to provide a substantially higher impedance to audio signals outside of the such frequency band. The inductors for each channel are physically oriented and electrically connected so that the magnetic fields generated by the inductors for each channel are self cancelling, resulting in a net magnetic field for the channel which is negligible, and is preferably substantially zero.

In particular, each channel for preferred embodiments has an even number of inductors, with each pair of adjacent inductors being substantially matched and being oriented so that an audio signal flowing through the pair of inductors produces substantially equal magnetic fields for each inductor, which fields are oppositely polarized. The inductors for each pair should be located close enough to each other so that the magnetic fields are substantially cancelling. Each pair of coils are preferably located in close proximity to each other, with the inductors of each pair being side-by-side for preferred embodiments. For the preferred embodiment, there is a single pair of inductors for each channel. While it is not normally necessary, in some applications the inductance of at least one of the coils may be made variable to permit a more perfect balancing out of magnetic field emanation.

The foregoing and other objects, features and advantage of the invention will be apparent from the following more particular description of a preferred embodiment of the invention as illustrated in the accompanying drawings.

In the Drawings FIG. 1 is schematic block diagram of a filter circuit in accordance with the teachings of this invention.

FIG. 2 is a diagram illustrating a coil pair for use in a filter channel of FIG. 1 and of illustrative magnetic field lines for each coil of the pair.

DETAILED DESCRIPTION

Figure 1:
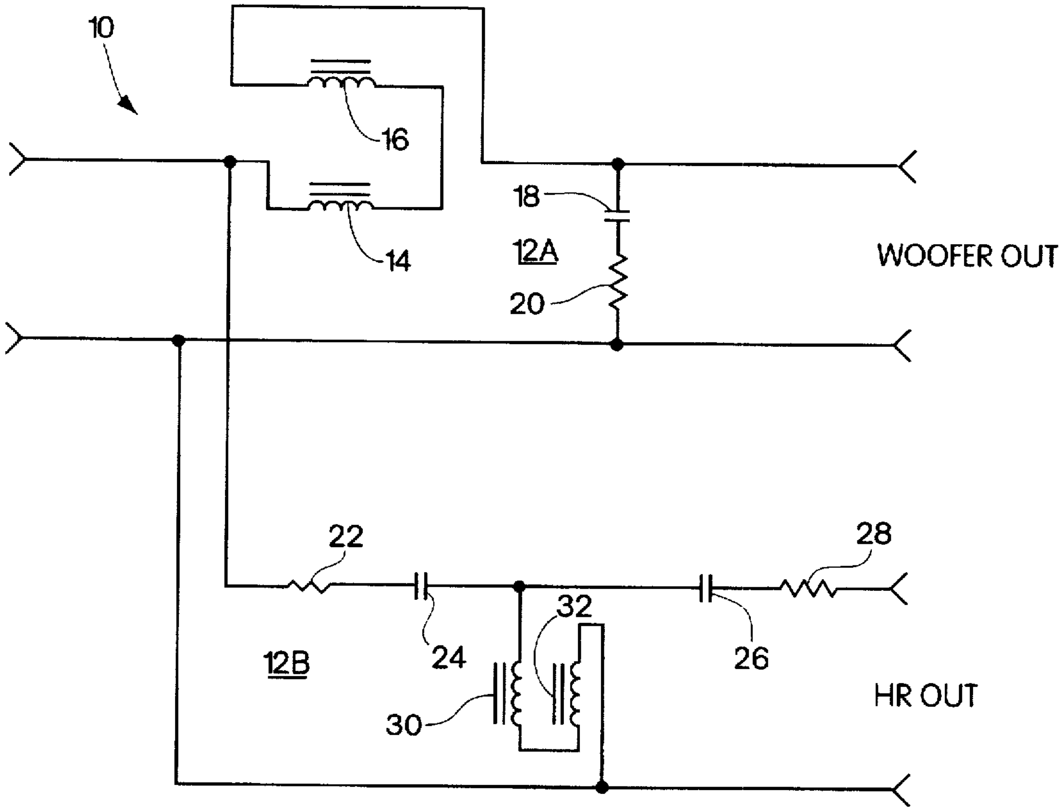

Referring to FIG. 1, the electric filter circuit 10 has a low frequency range or woofer channel 12A and a high frequency range or tweeter channel 12B. Channel 12A has a pair of inductors 14 and 16 connected in series in its positive line with a series connected capacitor 18 and resistor 20 connected between -he positive and negative lines of this channel. Channel 12B has resistor 22, capacitors 24 and 26 and resistor 28 connected in series in its negative line, with a pair of matched inductors 30 and 32 connected in series across the lines of the channel.

Figure 2:
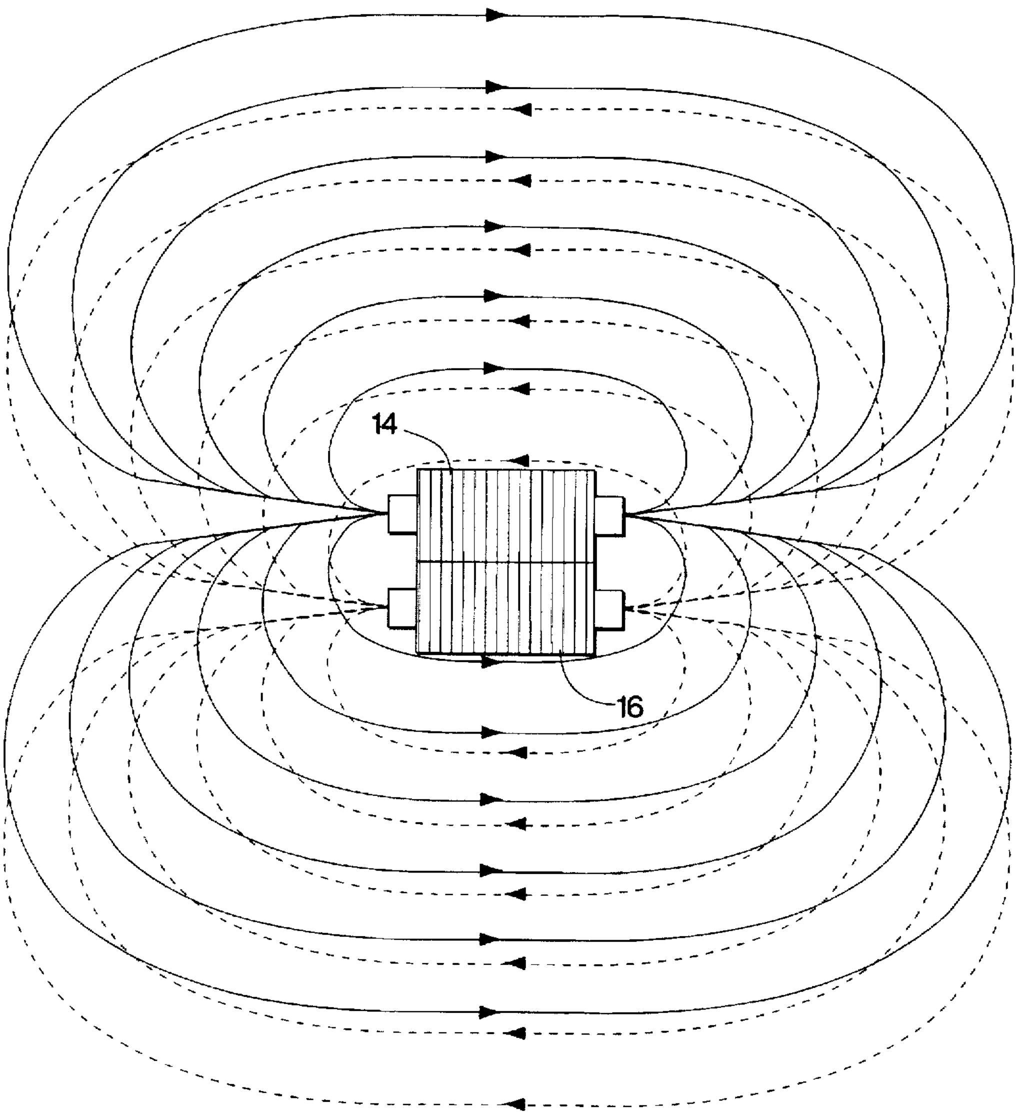

Inductors 14 and 16 are substantially matched as are inductors 30 and 32. The pair of inductors for each channel are preferably positioned in close proximity to each other, and, referring to FIG. 2, for the preferred embodiment the inductor coils are positioned side-by-side. While for purposes of illustration, the coils in FIG. 2 are labeled as 14 and 16, coils 30 and 32 would be similarly positioned. Since, as may be seen from FIG. 1, the inductors for each channel are oriented so that current is flowing in opposite directions through the two inductors for each channel, the magnetic fields for the inductors are, as shown in FIG. 2, polarized in opposite directions. Therefore, as may be seen in FIG. 2, with the coils positioned side-by-side, these magnetic fields substantially cancel each other, with a substantially zero resulting magnetic field emanating from the coils of each channel, and thus from the filter 10.

The inductor coil for each channel in FIG. 1 has been shown as being divided into two substantially matching coils which, when used as a pair and wired in a circuit as shown, produce the original inductance value of the single coil or inductor which would normally be used for the channel. The value for each inductor is typically somewhat less than half the original inductance value. However, the original single inductor may be split into more than two inductors in order to provide the desired cancelling fields, and while typically the circuit would be designed with an even number of coils for ease of design, a circuit having the desired magnetic field cancelling characteristics can also be designed with an odd number of adjacent coils. Further, while it is desired that the inductors be substantially matched in order to optimize magnetic field cancellation, as a practical matter, absolute matching of the inductors is not essential, and satisfactory results can typically be achieved so long as the inductance of the coils matches within approximately ten percent. To the extent a high degree of cancellation may be desired, either one or both inductors for a channel may be made variable to permit fine tuning of the inductors for optimum magnetic field cancellation. Further, in some filter circuits, the inductors for the low frequency channels may produce far more magnetic field than those for the high frequency channels, and it may therefore be necessary to practice the teachings of this invention only for the lowfrequency channels and not necessarily for all frequency channels. The same techniques for magnetic field cancellation could also be used for any mid-range or other channels of the filter. Finally while a particular audio filter circuit has been shown in FIG. 1, the teachings of this invention may be utilized with other audio filter circuits utilizing magnetic field generating inductor coils. Thus, while the invention has been particularly shown and described above with respect to a preferred embodiment, the foregoing and other changes in form and detail may be made therein by one skilled in the art without departing from the spirit and scope of the invention.

What is claimed is:

1. In a loudspeaker system having at least two speakers, each of which is designed to operate in a selected frequency band, an electric filter circuit for applying audio signals to each of said speakers which is in the frequency band for which the speaker is designed, the filter circuit comprising:

a filter channel for each of said speakers, each of said channels having at least two inductors which inductors are selected and connected so as to provide, in conjunction with other circuitry of the channel, a low impedance to audio signals flowing through the inductors in the frequency band for the corresponding speaker, and to provide a substantially higher impedance to audio signals outside said frequency band, the inductors for each channel being physically oriented and electrically connected so that the magnetic fields generated as a result of the audio signal flowing through the inductors for each channel are self-cancelling, resulting in a net magnetic field for the channel which is negligible.

2. A filter circuit as claimed in claim 1 wherein there are an even number of inductors for each channel with each pair of adjacent inductors being substantially matched and being oriented so that audio signals flowing through the pair of inductors produces substantially equal magnetic fields for each inductor which are oppositely polarized, the inductors of each pair being located close enough to each other so that said magnetic fields are substantially cancelling.

3. A filter circuit as claimed in claim 2 wherein each pair of adjacent inductors is in close proximity to each other.

4. A filter circuit as claimed in claim 2 wherein the inductors of each pair are side by side.

5. A filter circuit as claimed in claim 1 wherein there is a single pair of inductors for each channel, the inductors in each pair being side by side in close proximity to each other.

* * * * *